United States Patent
Hsu

(10) Patent No.: US 7,396,700 B2
(45) Date of Patent: Jul. 8, 2008

(54) METHOD FOR FABRICATING THERMALLY ENHANCED SEMICONDUCTOR DEVICE

(75) Inventor: Shih-Ping Hsu, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 205 days.

(21) Appl. No.: 10/876,469

(22) Filed: Jun. 28, 2004

(65) Prior Publication Data
US 2005/0048759 A1 Mar. 3, 2005

(30) Foreign Application Priority Data
Aug. 28, 2003 (TW) .............................. 92123711 A

(51) Int. Cl.
*H01L 21/44* (2006.01)
(52) U.S. Cl. ...................................... 438/107; 257/706

(58) Field of Classification Search ......... 438/106–108, 438/612–614, 618, 674; 257/684, 700, 706, 257/707, 783–784, 720, E23.178
See application file for complete search history.

(56) References Cited

U.S. PATENT DOCUMENTS 6,351,031 B1 * 2/2002 Iijima et al. ................. 257/698

* cited by examiner

*Primary Examiner*—David Vu
(74) *Attorney, Agent, or Firm*—William F. Nixon; Clark & Brody

(57) ABSTRACT

A method for fabricating a thermally enhanced semiconductor device. A support plate having at least one opening is mounted on a heat sink. At least one chip is mounted on the heat sink and received in the opening. An insulating layer is formed over the chip and the support plate and filled in the opening. A plurality of vias are formed in the insulating layer to expose electrode pads on the chip. A conductive layer is deposited on the insulating layer and the exposed electrode pads. A resist layer is formed on the conductive layer and patterned to expose a predetermine part on the conductive layer. Then, a patterned circuit layer is deposited on the exposed part of the conductive layer by electroplating. The patterned resist layer and the conductive layer underneath the patterned resist layer are removed. A plurality of conductive elements are formed on the circuit layer.

13 Claims, 5 Drawing Sheets

METHOD FOR FABRICATING THERMALLY ENHANCED SEMICONDUCTOR DEVICE

FIELD OF THE INVENTION

The present invention relates to methods for fabricating thermally enhanced semiconductor devices, and more particularly, to a method for fabricating a semiconductor device incorporated with a heat sink, at least one chip and at least one circuit build-up structure.

BACKGROUND OF THE INVENTION

The evolution of the packaging technology has developed various types of semiconductor packages. For example, BGA (ball grid array) package employs advanced packaging technology to mount a semiconductor chip on a front side of a substrate and use the self-alignment technique to form an array of solder balls on a back side of the substrate. This allows a unit area on the substrate or chip carrier to accommodate more solder balls or input/output (I/O) connections to be suitable for the chip that is highly integrated, and the solder balls or I/O connections are used to bond and electrically connect the semiconductor package to an external device such as printed circuit board (PCB).

However, the above semiconductor package may cause significant problems during practical operation. Since there are a plurality of electronic elements and electronic circuits densely disposed on the chip, a huge amount of heat would be generated by these electronic elements and circuits; if the heat cannot be efficiently dissipated, the performance and lifetime of the chip may be damaged by overheat. Further, the semiconductor package lacks a shielding mechanism and thus is easily subject to external electromagnetic interference and noises.

In order to solve the above problems, a cavity-down BGA (CDBGA) package is provided as shown in FIG. 1, which is characterized in a cavity formed in a substrate to allow a semiconductor chip to be received in the cavity and attached to the substrate in a face-down manner. This CDBGA package 10 comprises a substrate 11, a heat sink 12, at least one semiconductor chip 13, a plurality of bonding wires 14, an encapsulation body 15, and a plurality of solder balls 16.

The substrate 11 has a front side 11a and a back side 11b and is formed with an cavity 111. The heat sink 12 is made of a good thermally conductive material such as copper and is attached to the front side 11a of the substrate 11 to seal one end opening of the cavity 111. The chip 13 has an active surface 13a and an inactive surface 13b. The chip 13 is received in the cavity 111 in a face-down manner that the inactive surface 13b is attached to the heat sink 12. A wire-bonding process is performed to form the plurality of bonding wires 14 that electrically connect the active surface 13a of the chip 13 to the substrate 11. Then a molding process is carried out to form the encapsulation body 15 that completely encapsulates the chip 13 and the bonding wires 14. Finally a ball-implanting process is performed to implant the plurality of solder balls 16 on the back side 11b of the substrate 11, such that the CDBGA package 10 is fabricated.

The heat sink in the above CDBGA package may desirably provide the heat-dissipating and shielding effects. However, the solder balls for connecting the package to the external PCB must be made with a height larger than a height of wire loops of the bonding wires protruding on the back side of the substrate; this arrangement restricts the routability on the substrate and set a limitation on the size of the solder balls. Moreover, the bonding wires bonded to the chip are densely arranged and easily subject to short circuit if adjacent bonding wires accidentally come into contact with each other, thereby making the wire-bonding process difficult to implement. During the molding process, the chip-bonded and wire-bonded substrate is placed in an encapsulation mold, an epoxy resin is injected into a cavity of the mold to form the encapsulation body encapsulating the chip and bonding wires that are received in the cavity. However in the practical operation, the substrate may not be tightly clamped by the mold due to the mismatch between clamping positions on the substrate and size of the cavity of the mold. When the epoxy resin is injected into the cavity, it would flash over unintended area on the substrate that is not tightly clamped; the resin flash degrades the appearance of the fabricated package and also adversely affects the quality of electrical connection of the package. Further, the injected resin is a fluid that generates mold flow impact on the bonding wires formed on the substrate. If the flow speed of the resin is unduly high, the mold flow impact would be great to shift the bonding wires and cause undesirable contact or short circuit between adjacent bonding wires, thereby severely damaging the quality and reliability of the fabricated package.

In addition, for general fabrication of semiconductor devices, chip carriers such as substrates or lead frames suitable for semiconductor devices are fabricated by a chip-carrier manufacturer. Then, these fabricated chip carriers are transferred to a packaging manufacturer and subject to chip-bonding, wire-bonding, molding and ball-implanting processes to form the semiconductor devices with desirable functionality that are requested by clients. Such fabrication processes involve different manufacturers, not only making the fabrication processes complex but also making the semiconductor devices difficult to change the design thereof.

Therefore, the problem to be solved herein is to provide a semiconductor device, which can be fabricated by simple processes and reduced cost and also can eliminate the above drawbacks of heat dissipation, electromagnetic interference and resin flash.

SUMMARY OF THE INVENTION

A primary objective of the present invention is to provide a method for fabricating a thermally enhanced semiconductor device, which combines fabrication of a chip carrier and the semiconductor packaging technology to provide greater flexibility to meet customary requirements and simplify the fabrication processes.

Another objective of the present invention is to provide a method for fabricating a thermally enhanced semiconductor device, which can effectively dissipate heat produced from a semiconductor chip incorporated in the semiconductor device and provide an electromagnetic shielding effect for the semiconductor device to eliminate external electromagnetic interference and noises.

A further objective of the present invention is to provide a method for fabricating a thermally enhanced semiconductor device, which can prevent short circuit caused by contact between adjacent bonding wires during a wire-bonding process, and avoid resin flash in a molding process, so as to assure the quality and reliability of the fabricated semiconductor device.

In accordance with the above and other objectives, the present invention proposes a method for fabricating a thermally enhanced semiconductor device, comprising the steps of: preparing a support plate (such as metal plate, insulating plate or circuit board) having an opening that penetrates through the support plate; mounting the support plate on a heat sink that covers the opening; attaching a surface of at least one semiconductor chip to the heat sink and receiving the chip in the opening of the support plate; performing a circuit build-up process to form an insulating layer on the chip and the support plate, the insulating layer filled in the opening of the support plate; forming a plurality of vias in the insulating layer to expose a plurality of electrode pads on the chip; forming a circuit layer on the insulating layer and the exposed electrode pads; forming a patterned resist layer on the circuit layer, with a predetermined part of the circuit layer exposed from the patterned resist layer; performing an electroplating process to deposit a patterned circuit layer on the predetermined part of the circuit layer; removing the resist layer and the circuit layer underneath the resist layer; performing another circuit build-up process to form a circuit build-up structure; and forming a plurality of conductive elements on the circuit build-up structure, allowing the semiconductor device to be electrically connected to an external device via the conductive elements.

In the use of the above fabrication method for semiconductor device, at least one semiconductor chip is attached to a heat sink via a thermally conductive adhesive, so as to effectively dissipate heat produced from the chip. The heat sink is usually made of a metallic material, which can provide a good electromagnetic shielding effect for the semiconductor device. The chip is received in an opening of a metal plate, insulating plate or circuit board mounted on the heat sink, such that the overall thickness of the semiconductor device can be reduced for size miniaturization. Moreover, at least one circuit build-up structure is formed on the metal plate, insulating plate or circuit board. The circuit build-up structure comprises at least one insulating layer, circuit layer and conductive via. The conductive via is formed in the insulating layer to electrically connect the circuit layer to electrode pads on the chip. Lastly, a plurality of conductive elements such as solder balls, pins or posts are implanted on an exposed surface of the circuit build-up structure to allow the semiconductor device to be electrically coupled to an external device.

Therefore, the semiconductor device is incorporated with the heat sink, the chip and the circuit build-up structure, which can combine fabrication of the chip carrier and the semiconductor packaging technology, so as to provide greater flexibility to meet customary requirements and simplify the fabrication processes as well as avoid the prior-art problems such as short circuit and resin flash in the wire-bonding and molding processes.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a thermally enhanced semiconductor device and its fabrication method proposed in the present invention are described with reference to FIGS. 2A-2K and 3.

FIGS. 2A-2K show a series of procedural steps of the method for fabricating a thermally enhanced semiconductor device according to a first preferred embodiment of the present invention.

Figure 1:
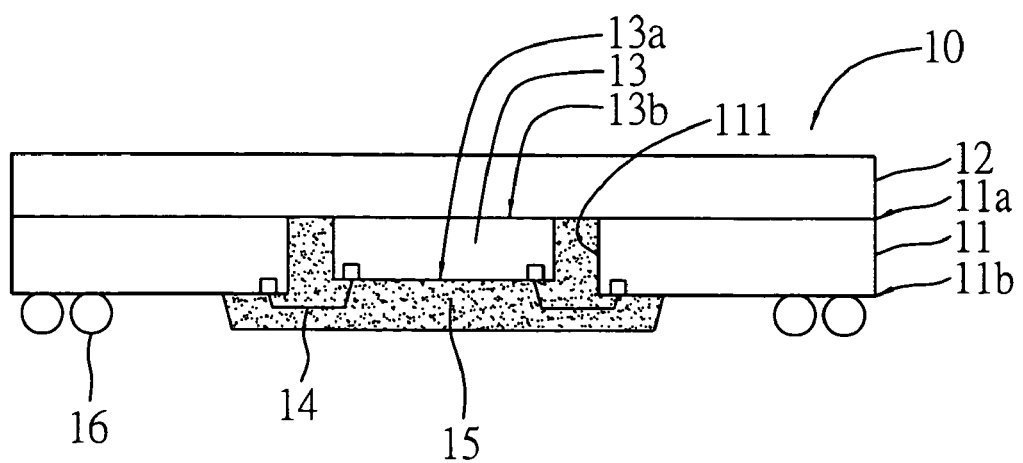
FIG. 1 (PRIOR ART) is a cross-sectional view of a conventional CDBGA semiconductor package.
Figure 2A:
FIGS. 2A-2K are cross-sectional views showing a series of procedural steps of a method for fabricating a thermally enhanced semiconductor device according to a first preferred embodiment of the present invention.

Referring to FIG. 2A, a support plate 22 is prepared, which can be a metal plate, insulating plate or circuit board. The support plate 22 is formed with at least one opening 220 penetrating through the same. The metal plate can be made of copper. The insulating plate can be made of epoxy resin, polyimide resin, cyanate ester, carbon fiber, BT (bismaleimide triazine) resin, or a mixture of epoxy resin and fiber glass. The circuit board can be a pre-treated multi-layer circuit board, which is composed of a core layer with a conductive metal layer formed on at least one surface of the core layer; next the conductive metal layer is patterned to form a circuit layer; then a build-up process is performed to sequentially deposit at least one insulating layer and circuit layer on the patterned circuit layer, wherein a plurality of conductive vias are formed through the insulating layer to electrically interconnect the overlying and underlying circuit layers, such that the multi-layer circuit board is fabricated.

Figure 2B:
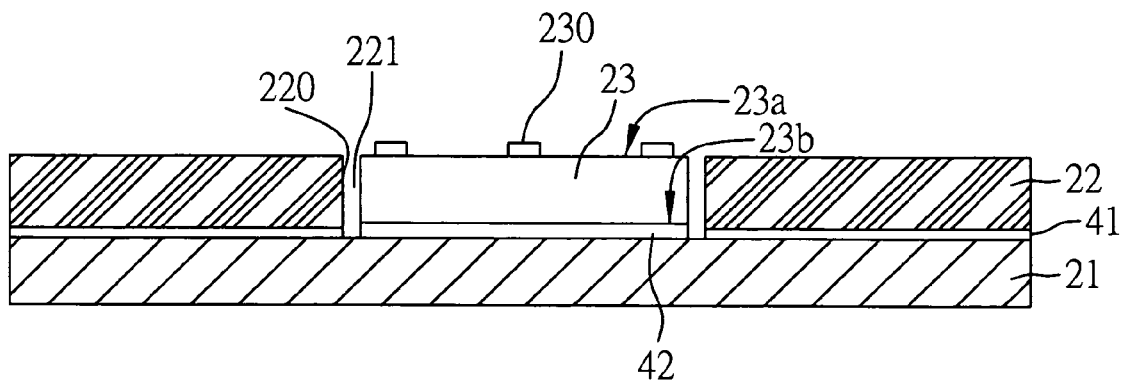

Referring to FIG. 2B, the support plate 22 is mounted on a heat sink 21 via a thermally conductive adhesive 41, wherein the heat sink 21 seals one side of the opening 220. At least one semiconductor chip 23 is attached via an inactive surface 23b thereof to the heat sink 21 by means of a thermally conductive adhesive 42 and is received in the opening 220, allowing electrode pads 230 formed on an active surface 23a of the chip 23 to be exposed to the support plate 22. For enhancing the bonding between the support plate 22 and the heat sink 21, a surface of the support plate 22 in contact with the heat sink 21 can be roughened in advance.

Figure 2C:
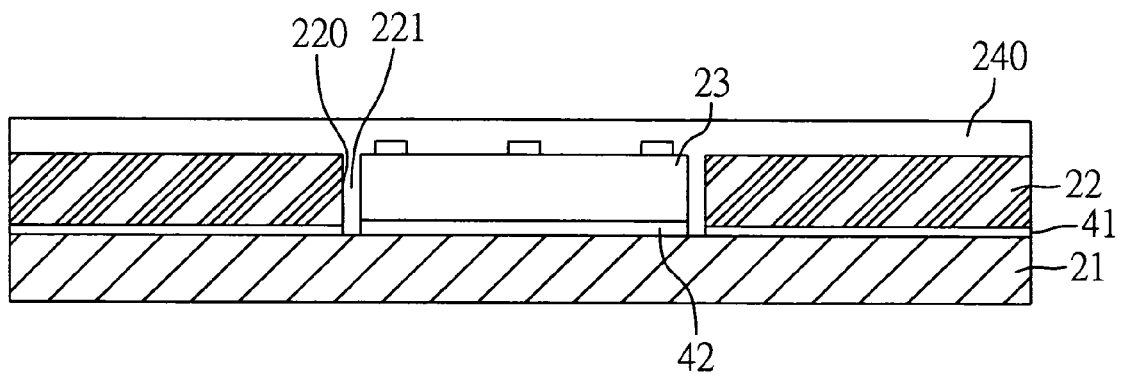

Referring to FIG. 2C, then a circuit build-up process is performed on the support plate 22 and the chip 23. An insulating layer 240 is formed on an exposed surface of the support plate 22 and the active surface 23a of the chip 23 and is filled in a gap 221 between the support plate 22 and the chip 23. The insulating layer 240 can be made of fiber enhanced resin, phenolic polyester, epoxy resin or photoimageable polymer.

Figure 2D:
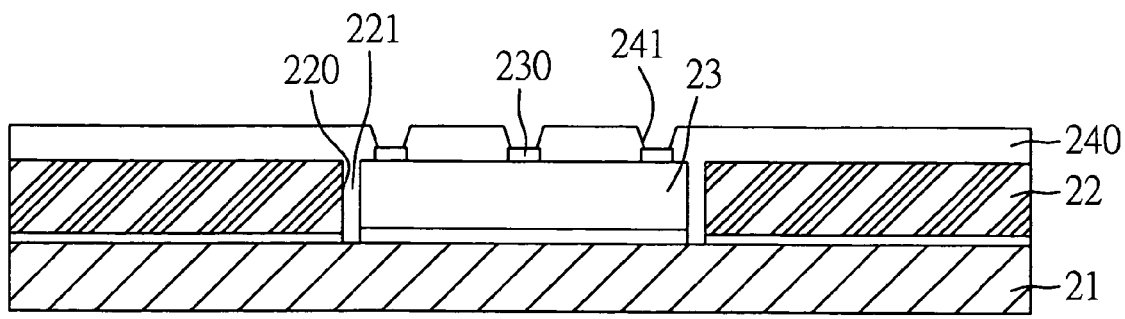

Referring to FIG. 2D, a plurality of vias 241 are formed through the insulating layer 240 by e.g. laser drilling technique or exposing and developing processes to expose the electrode pads 230 on the active surface 23a of the chip 23.

Figure 2E:
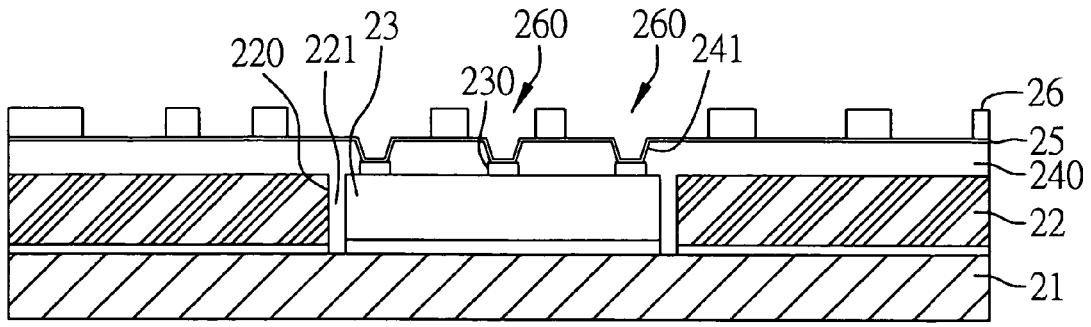

Referring to FIG. 2E, a conductive layer 25 is deposited on the insulating layer 240 and the exposed electrode pads 230. A resist layer 26 is formed on the conductive layer 25 and patterned to form a plurality of holes 260 corresponding in position to the vias 241, allowing a predetermined part of the conductive layer 25 to be exposed via the holes 260. The conductive layer 25 primarily serves as a current conductive path for a subsequent electroplating process. The conductive layer 25 can be made of metal, alloy or a plurality of stacked metal layers, such as copper (Cu), tin (Sn), nickel (Ni), chromium (Cr), titanium (Ti), and/or Cu—Cr alloy. The conductive layer 25 can be formed by physical vapor deposition (PVD), chemical vapor deposition (CVD), electroless plating or chemical deposition, such as sputtering, evaporation, arc vapor deposition, ion beam sputtering, or plasma enhanced CVD. According to practical implementation, the conductive layer 25 is preferably made by electroless-plated copper particles.

Figure 2F:
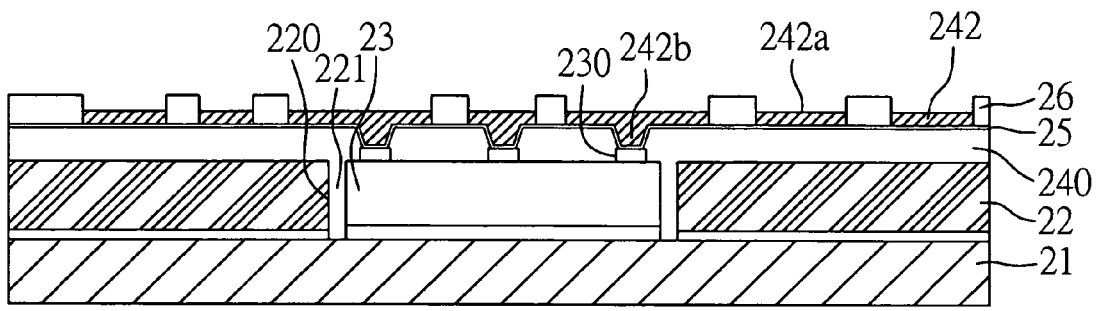

Referring to FIG. 2F, an electroplating process is performed to form a patterned circuit layer 242 on the exposed part of the conductive layer 25. The patterned circuit layer 242 comprises conductive traces 242a corresponding in position to the insulating layer 240 and conductive vias 242b corresponding in position to the vias 241, such that the circuit layer 242 can be electrically connected to the electrode pads 230 on the chip 23 via the conductive vias 242b, and also allows subsequently-fabricated circuit build-up structures on the support plate 22 to be electrically coupled to the chip 23.

Figure 2G:
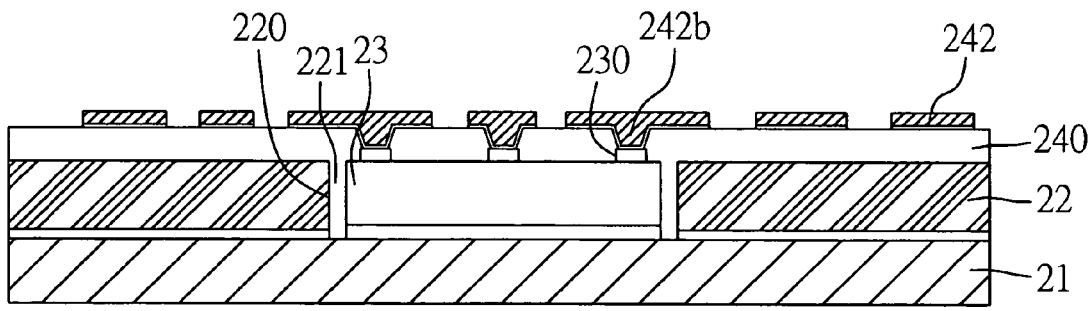

Referring to FIG. 2G, the resist layer 26 and the conductive layer 25 underneath the resist layer 26 are removed.

Figure 2H:
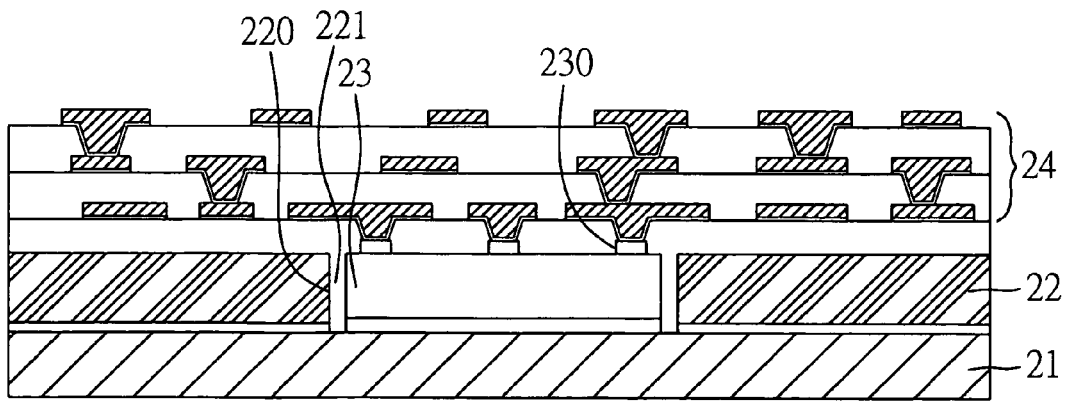

Referring to FIG. 2H, the above steps are repeated to perform another circuit build-up process and form a circuit build-up structure 24 on the support plate 25 having the chip 23, allowing the circuit build-up structure 24 to be electrically coupled to the electrode pads 230 on the chip 23.

Figure 2I:
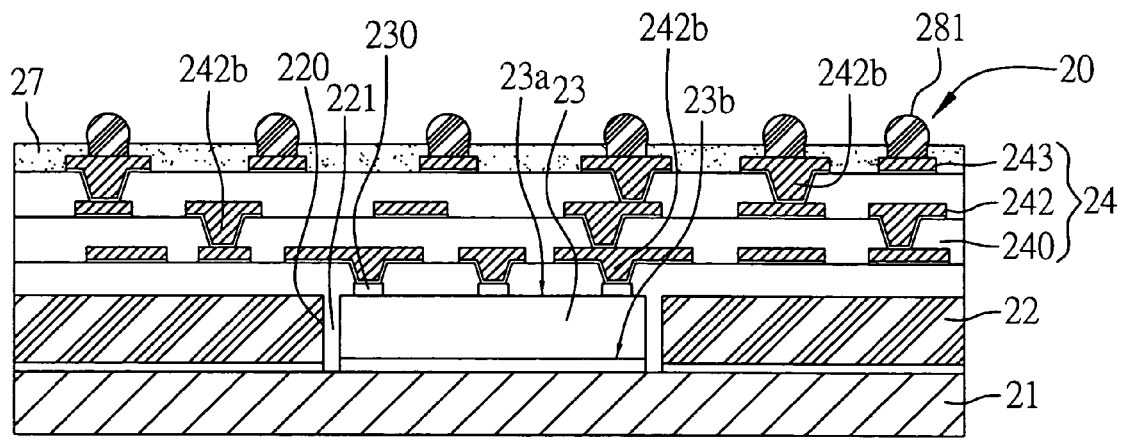
Figure 2J:
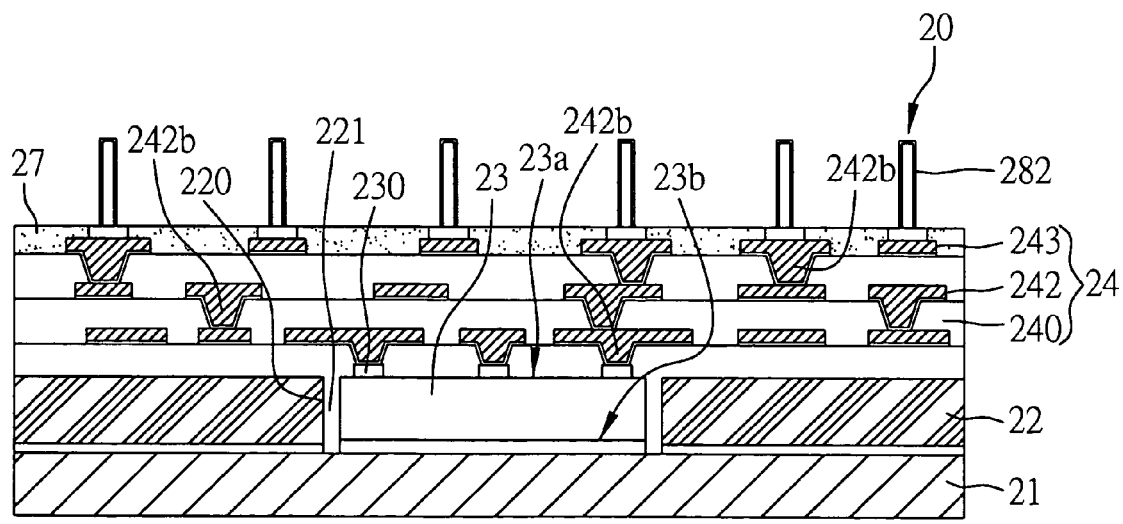
Figure 2K:
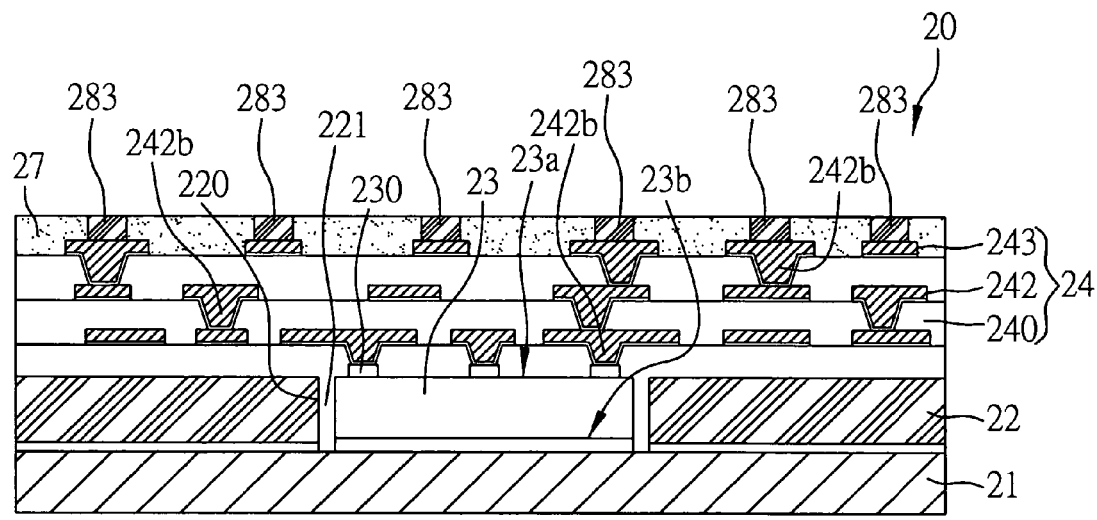

Referring to FIG. 2I, a solder mask layer 27 is applied on an exposed surface of the circuit build-up structure 24 and patterned to form a plurality of holes to expose connection pads 243 on the circuit build-up structure 24, such that a plurality of conductive elements such as solder balls 281 or pins 282 (FIG. 2J) can be formed on the connection pads 243; alternatively, a plurality of posts 283 (FIG. 2K) can be formed on the connection pads 243 during fabrication of the outermost circuit layer for the circuit build-up structure 24. The solder balls 281, pins 282 or posts 283 are used to electrically connect the fabricated semiconductor device 20 to an external device.

As shown in FIG. 2I, the semiconductor device 20 fabricated by the above method comprises: a heat sink 21; a support plate 22 mounted on the heat sink 21 and having at least one opening 220 penetrating through the support plate 22; at least one semiconductor chip 23 received in the opening 220 and attached to the heat sink 21; and a circuit build-up structure 24 formed on the support plate 22 and having conductive vias 242b electrically connected to electrode pads 230 on the chip 23.

The heat sink 21 is made of a good thermally conductive and rigid material such as copper. An exposed surface of the heat sink 21 can be corrugated to increase the heat dissipating area and thermal conductive area of the heat sink 21.

The support plate 22 can be a metal plate having at least one opening 220 penetrating through the metal plate, and is attached to the heat sink 21 via a thermally conductive adhesive 41 to allow the heat sink 21 to seal one side of the opening 220. The metal plate can be made of the same material as for the heat sink 21. The metal plate may serve as a grounding member to provide a better grounding effect for the semiconductor device 20.

Moreover, the support plate 22 can also be an insulating plate made of an organic-material or a fiber enhanced organic material, such as epoxy resin, polyimide resin, BT (bismaleimide triazine) resin, cyanate ester, FR4 resin or FR5 resin. The insulating plate can be attached to the heat sink 21 via an adhesive or is directly pressed on the heat sink 21, allowing the chip 23 to be received in an opening of the insulating plate and attached to the heat sink 21 via a thermally conductive adhesive 42.

The semiconductor chip 23 has an active surface 23a and an inactive surface 23b, with a plurality of electrode pads 230 formed on the active surface 23a. The inactive surface 23b of the chip 23 is attached to the heat sink 21 via the thermally conductive adhesive 42, making the chip 23 received in the opening 220 of the support plate 22, such that heat generated from the chip 23 can be dissipated through a thermally conductive path including the thermally conductive adhesive 42 and the heat sink 21, and the heat sink 21 can provide an electromagnetic shielding effect for the chip 23.

The circuit build-up structure 24 is formed on the support plate 22, and comprises at least one insulating layer 240, a plurality of circuit layers 242 spaced apart from each other by the insulating layer 240, and a plurality of conductive vias 242b penetrating through the insulating layer 240 to electrically interconnecting the circuit layers 242, wherein the conductive vias 242b are electrically connected to the electrode pads 230 on the chip 23 received in the opening 220 of the support plate 22. A plurality of connection pads 243 are formed on an exposed surface of the circuit build-up structure 24, allowing a plurality of solder balls 281, pins 282 or posts 283 to be implanted on the connection pads 243. This completes the fabrication of the semiconductor device 20 incorporated with the heat sink 21, the chip 23 and the circuit build-up structure 24, wherein the chip 23 can be electrically coupled via its electrode pads 230 to an external device such as printed circuit board (PCB) through the conductive vias 242b and circuit layers 242 of the circuit build-up structure 24 and the solder balls 281, pins 282 or posts 283.

Figure 3:
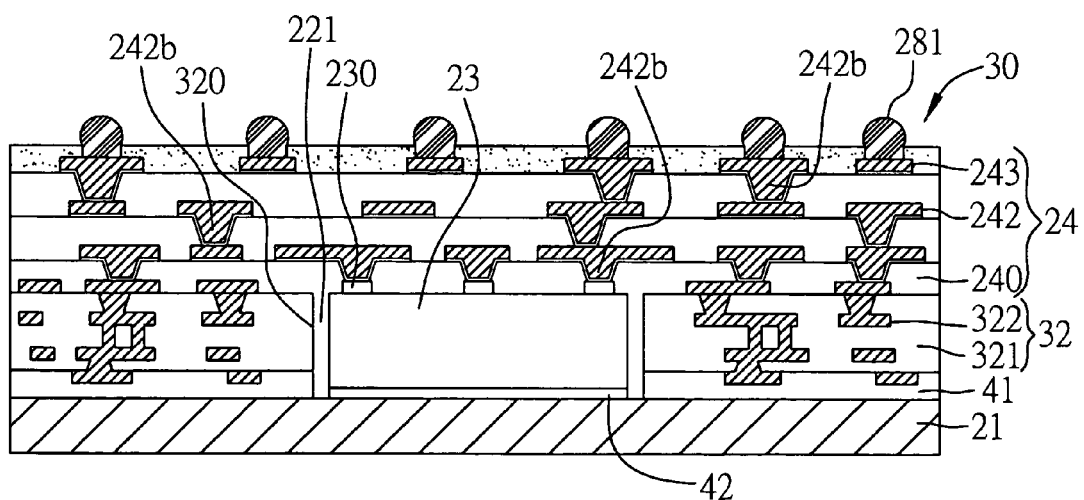
FIG. 3 is a cross-sectional view of a thermally enhanced semiconductor device according to a second preferred embodiment of the present invention.

FIG. 3 shows a thermally enhanced semiconductor device according to a second preferred embodiment of the present invention. As shown in FIG. 3, this semiconductor device 30 is structurally similar to that disclosed in the above first embodiment, with the difference in that in this second embodiment, the support plate mounted on the heat sink is a circuit board 32. The circuit board 32 comprises at least one insulating layer 321 and a plurality of circuit layers 322 spaced apart from each other by the insulating layer 321. The circuit board 32 has been subject to the front-stage fabrication processes such as formation of a plurality of plated through holes (PTH) or conductive vias. The circuit board 32 is attached to the heat sink 21 via a thermally conductive adhesive 41, and at least one semiconductor chip 23 is received in an opening 320 of the circuit board 32 and mounted to the heat sink 21 via a thermally conductive adhesive 42.

Moreover, a circuit build-up structure 24 is similarly formed on the circuit board 32, wherein a plurality of conductive vias 242b are formed in the circuit build-up structure 24 and electrically connect electrode pads 230 on the chip 23 to the circuit build-up structure 24. The circuit layout of the circuit board 32 can provide better electrical performance for the semiconductor device 30. Then, solder balls 281 (FIG. 3), pins 282 or posts 283 (shown in FIG. 2J or FIG. 2K) are implanted on an exposed surface of the circuit build-up structure 24, which can electrically connect the chip 23 to the external device. Thereby the semiconductor device 30 incorporated with the heat sink 21, the chip 23 and the circuit build-up structure 24 is fabricated.

The fabrication method of a thermally enhanced semiconductor device according to the present invention is to receive at least one semiconductor chip in an opening of a metal plate, insulating plate or circuit board and mount the chip and the metal plate, insulating plate or circuit board on a heat sink. Then, a circuit build-up structure is formed on the chip and the metal plate, insulating plate or circuit board. The circuit build-up structure comprises at least one insulating layer, at least one circuit layer and at least one conductive via, wherein the conductive via is used to electrically connect at least one electrode pad on the chip to the circuit build-up structure. A plurality of conductive elements such as solder balls, pins or posts are implanted on an exposed surface of the circuit build-up structure, so as to allow the chip to be electrically coupled to an external device via the electrode pad, the conductive via of the circuit build-up structure, the circuit layer and the conductive elements, such that the semiconductor device incorporated with the heat sink, the chip and the circuit build-up structure can be fabricated. This combines fabrication of the chip carrier and the semiconductor packaging technology, which can provide greater flexibility to meet customary requirements and simplify the fabrication processes, as well as avoid the prior-art problems of short circuit and resin flash respective during the wire-bonding and bonding processes, thereby effectively improving the quality and reliability of the fabricated semiconductor device.

Moreover, the semiconductor chip is attached to the heat sink via a thermally conductive adhesive, such that heat produced from the chip can be efficiently dissipated through the thermally conductive adhesive and the heat sink, and also the heat sink can provide an electromagnetic shielding effect. The chip is received in the opening of the metal plate, insulating plate or circuit board mounted on the heat sink, and this arrangement can greatly decrease the overall thickness of the semiconductor device that is thus miniaturized in size.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a thermally enhanced semiconductor device, the method comprising the steps of:
    preparing a support plate having an opening that penetrates through the support plate;
    mounting the support plate on a heat sink that covers the opening;
    attaching a surface of at least one semiconductor chip to the heat sink and receiving the chip in the opening of the support plate;
    forming an insulating layer to cover the chip and the support plate and fill in a gap between the chip and the support plate;
    forming a plurality of vias in the insulating layer to expose a plurality of electrode pads on the chip;
    forming a conductive layer on the insulating layer and the exposed electrode pads;
    forming a patterned resist layer on the conductive layer, with a predetermined part of the conductive layer exposed from the patterned resist layer;
    performing an electroplating process to deposit a patterned circuit layer on the predetermined part of the conductive layer, and the patterned circuit layer is formed with a plurality of conductive traces and conductive vias, and is electrically connected directly to the electrode pads of the chip by the conductive vias, wherein the conductive vias are disposed onto the electrode pads; and
    removing the resist layer and the conductive layer underneath the resist layer.

2. The method of claim 1, further comprising performing another circuit build-up process to form a circuit build-up structure on the support plate.

3. The method of claim 2, wherein a plurality of conductive elements are formed on an exposed surface of the circuit build-up structure.

4. The method of claim 1, wherein a surface of the support plate in contact with the heat sink is roughened.

5. The method of claim 1, wherein the heat sink is made of a good thermally conductive and rigid material.

6. The method of claim 1, wherein the chip is attached to the heat sink via a thermally conductive adhesive.

7. The method of claim 1, wherein the support plate is a metal plate, insulating plate or circuit board.

8. The method of claim 7, wherein the metal plate is formed with an opening penetrating through the same, and is attached to the heat sink via a thermally conductive adhesive, allowing the heat sink to seal one side of the opening.

9. The method of claim 7, wherein the heat sink and the metal plate are integrally fabricated by etching a metal block to form a recessed portion where the chip is to be received.

10. The method of claim 7, wherein the metal plate serves as a grounding member.

11. The method of claim 1, wherein the semiconductor device comprises:
    the heat sink;
    the support plate having at least one opening and mounted on the heat sink;
    the at least one semiconductor chip is received in the opening of the support plate and attached to the heat sink, the chip having electrode pads thereon; and
    a circuit build-up structure formed on the support plate and formed with a plurality of conductive vias that directly electrically connects the circuit build-up structure to the electrode pads of the chip.

12. The method of claim 11, wherein a plurality of conductive elements are formed on an exposed surface of the circuit build-up structure.

13. The method of claim 11, wherein the circuit build-up structure further comprises at least one insulating layer, a plurality of circuit layers spaced apart from each other by the insulating layer, and a plurality of conductive vias for electrically interconnecting the circuit layers.

* * * * *